United States Patent
Kakinuma et al.

(10) Patent No.: US 9,989,565 B2
(45) Date of Patent: Jun. 5, 2018

(54) VEHICLE CONTROL APPARATUS

(71) Applicant: HONDA MOTOR CO., LTD., Tokyo (JP)

(72) Inventors: Katsuyoshi Kakinuma, Wako (JP); Minoru Nagasawa, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days. days.

(21) Appl. No.: 15/655,242

(22) Filed: Jul. 20, 2017

(65) Prior Publication Data

US 2018/0024173 A1 Jan. 25, 2018

(30) Foreign Application Priority Data

Jul. 25, 2016 (JP) .................................. 2016-145118

(51) Int. Cl.
| | |
|---|---|
| G01R 19/165 | (2006.01) |
| G01R 31/36 | (2006.01) |
| F02D 41/04 | (2006.01) |
| F02D 17/00 | (2006.01) |
| B60W 30/192 | (2012.01) |

(52) U.S. Cl.
CPC ..... *G01R 19/16542* (2013.01); *B60W 30/192* (2013.01); *F02D 17/00* (2013.01); *F02D 41/042* (2013.01); *G01R 31/3693* (2013.01); *B60W 2520/04* (2013.01)

(58) Field of Classification Search
None
See application file for complete search history.

(56) References Cited

U.S. PATENT DOCUMENTS

| 5,704,457 A | 1/1998 | Kimura et al. |
| 2001/0035757 A1* | 11/2001 | Maeckel ............... H02J 7/0036 324/426 |
| 2013/0060412 A1* | 3/2013 | Nakagawara ........... B60T 1/005 701/22 |
| 2015/0130400 A1* | 5/2015 | Inskeep ................. H02J 7/0054 320/105 |
| 2016/0208762 A1* | 7/2016 | Morita ................ F02N 11/0862 |
| 2016/0241027 A1* | 8/2016 | Lei ............................ H02J 1/00 |
| 2016/0318466 A1* | 11/2016 | Brooks ................. B60R 16/033 |

FOREIGN PATENT DOCUMENTS

| JP | H08-216843 A | 8/1996 |
| JP | 2003-172174 A | 6/2003 |
| JP | 2007-146677 A | 6/2007 |
| JP | 2016-89978 A | 5/2016 |

OTHER PUBLICATIONS

Japanese Office Action with English Translation dated Apr. 3, 2018, 3 pages.

* cited by examiner

*Primary Examiner* — Laura Nguyen
(74) *Attorney, Agent, or Firm* — Rankin, Hill & Clark LLP

(57) ABSTRACT

The power supply determining part determines whether there is a power supplied from outside of the vehicle to the battery at start-up of the engine. The alarming part alarms to prompt a driver to manually operate the automatic stop control part when it is determined that there is a power supplied from the outside by the power supply determining part.

6 Claims, 3 Drawing Sheets

VEHICLE CONTROL APPARATUS

CROSS REFERENCE TO RELATED APPLICATION

This application claims the foreign priority benefit under Title 35, United States Code, § 119(a)-(d) of Japanese Patent Application No. 2016-145118, filed on Jul. 25, 2016 in the Japan Patent Office, the disclosure of which is herein incorporated by reference in its entirety.

BACKGROUND OF THE INVENTION

1. Field of the Invention

The present invention relates to a vehicle control apparatus.

2. Description of the Related Art

The automatic parking brake system and the shift-by-wire system receive power supplied from a power supply device of a vehicle. Accordingly, when the power cannot be supplied from the battery due to deterioration of the battery, etc., it is possible that the system of the vehicle cannot sufficiently drive the automatic parking brake system and the shift-by-wire system. This may give the driver an unnatural feeling.

Therefore, JP H08-216843 disclosed that an alarm is made for the driver to prompt the driver to manually make vehicle stop operation.

However, JP H08-216843 did not consider that the engine may be started by Jump start using a booster cable. More specifically, the start of the engine may be performed by the Jump start. However, this is a situation in which there may be deterioration in the battery of the vehicle. Accordingly, also in this state, it is better to alarm the driver as described in JP H08-216843. However JP H08-216843 does not consider this point.

SUMMARY OF THE INVENTION

An aspect of the present invention provides a vehicle control apparatus capable of prompting a driver to manually operate a stopping state maintaining mechanism for maintaining the vehicle in a stopping state when the engine of the vehicle is started using a power supplied from an outside of the vehicle.

An aspect of the present invention provides a vehicle control apparatus comprising:

a power supply device;

an automatic stop control part that automatically operates a stop state maintaining mechanism of a vehicle, the stop state maintaining mechanism maintaining a stop state of the vehicle;

a power supply determining part that determines whether or not a power is supplied from an outside the vehicle to the power supply device of the vehicle; and an alarming part that performs an alarm for prompting a vehicle user to manually operate the stop state maintaining mechanism when the power supply determining part determines that there is the power supplied from the outside the vehicle.

DETAILED DESCRIPTION OF THE INVENTION

Hereinafter, embodiments of the present invention are described below, referring to drawings.

Figure 1:
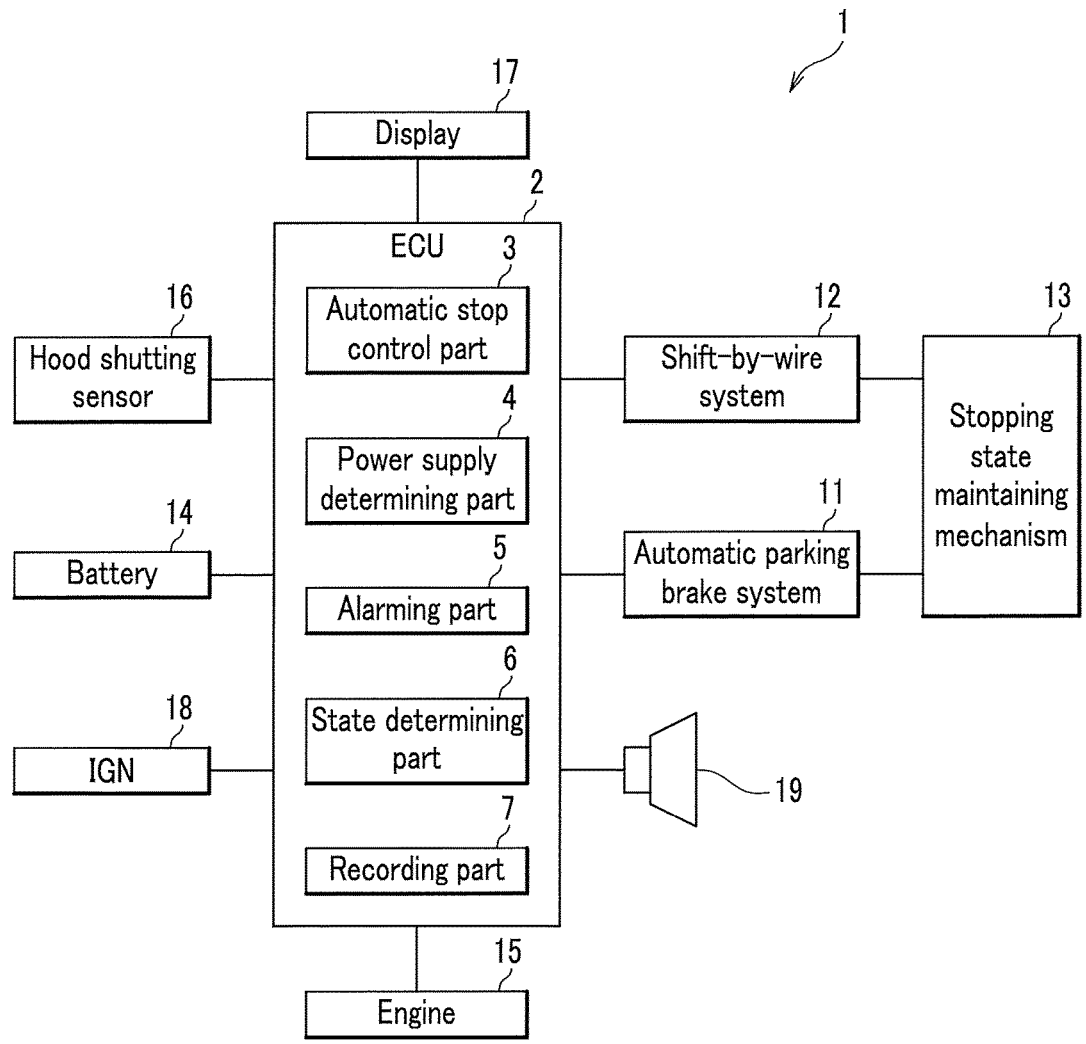
FIG. 1 is a block diagram of a vehicle control apparatus according to an embodiment of the present invention.

FIG. 1 is a block diagram of a vehicle control apparatus 1 according to an embodiment of the present invention.

An ECU (Electronic Control Unit) 2 is a computer for integrally controlling the whole of the vehicle control apparatus 1. An automatic stop control part 3 to a recording part 7 represent functional blocks of respective functions of the ECU 2.

An automatic parking brake system 11 of a vehicle is a system capable of performing an automatic parking braking even when there is no operation by a driver (for example, in the case where a parking brake is automatically driven when an ignition switch 18 is turned off). A shift-by-wire system 12 is a system for automatically operating a transmission by the ECU 2 (For example, the transmission is automatically shifted to a P range when the ignition switch 18 is turned off). Both the automatic parking brake system 11 and the shift-by-wire system 12 can automatically maintain the vehicle stopping by operating a stopping state maintaining mechanism 13.

The automatic stop control part 3 can maintain the stopping state of the vehicle by automatically operating the stopping state maintaining mechanism 13 by controlling the automatic parking brake system 11 and the shift-by-wire system 12 to maintain the stopping state of the vehicle.

A power supply determining part 4 determines whether there is power supply from the external to a battery 14 (power supply) of the vehicle or not. In other words, the power supply determining part 4 determines whether or not an engine 15 of the vehicle is started up by "Jump start" using a booster cable, the engine 15 including a starter. More specifically, when it is detected that a hood of the vehicle is open at start-up of the vehicle by a hood shutting sensor 16 for detecting that the hood of the vehicle is open or shut, it can be determined that the power supplying to the battery 14 from the external.

An alarming part 5 indicates on a display 17 a message prompting the driver to stop (not to move) the vehicle by performing a manual operation on the stopping state maintaining mechanism 13 at a predetermined timing (described later). The message may be provided vocally simultaneously using a speaker 19.

The display 17 is a display installed in the vehicle cabin for indicating the alarm.

A state determining part 6 determines a state of the battery 14. More specifically, when the start of the engine 15 has been completed, it is determined whether the previous start-up of the engine 15 has failed. When the battery 14 determines that the previous start-up of the engine has failed, it is determined that the battery 14 has an error.

The recording part 7 has a storing device of a non-volatile type for storing various data.

Figure 2:
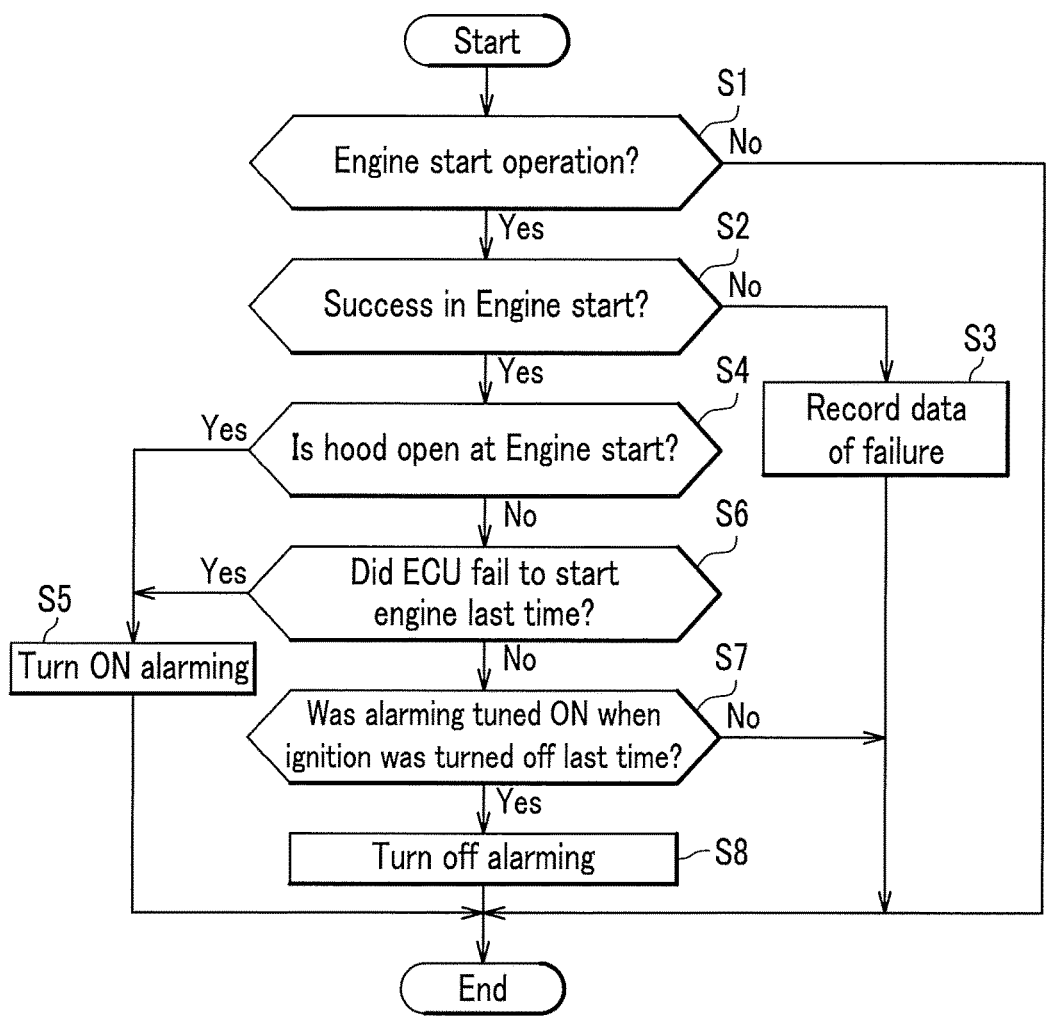
FIG. 2 is a flow chart illustrating operation of the vehicle control apparatus according to the embodiment of the present invention.

Next, processes executed by the ECU 2 are described below more specifically. FIG. 2 is a flow chart illustrating the alarming process. This process is repeatedly executed at a regular interval while the engine stops and the engine is being started up. First, the ECU 2 determines whether there is a starting operation of the engine 15. Alternatively, the ECU 2 may determine whether there was a starting operation of the engine 15 from previously executed processing to current processing. When there is the starting the engine 15 (Yes in the step S1), the state determining part 6 determines whether or not the engine 15 has been successfully started (S2). When the start of the engine 15 fails (No in S2), the recording part 7 of the ECU 2 stores data indicating the fact of the failure of the start-up of the engine in the memory. Alternatively, this information may be obtained by checking whether there is no record of information to be stored in the recording part 7 when the ECU 2 is shut down in a general operation caused by turning off the ignition key 18.

When the engine 15 has been successfully started (Yes in S2), the power supply determining part 4 in the ECU 2 determines whether or not the hood of the vehicle is open by the hood shutting sensor 16. It can be considered that the jump start has been performed with a booster cable when the hood of the vehicle is open at the start-up of the engine. In other words, it can be determined that the engine 15 of the vehicle is started with a power externally supplied to the vehicle. In this case (Yes in S4), the alarming part 5 of the ECU 2 alarms the driver to maintain the stop of the vehicle by prompting the driver to manually operate the stopping state maintaining mechanism 13 (S5). This alarming may be made vocally using a speaker 19.

When the hood is closed (No in S4), the state determining part 6 of the ECU 2 determines whether or not the start of the engine 15 failed last time, referring the recording part 7. When the start of the engine 5 fails (Yes in S6), the alarming part 5 of the ECU 2 alarms similarly (S5).

Next, when the start of the engine did not fail (No in S6), the alarming part 5 of the ECU 2 determines whether or not the mode last time is a mode for alarming when the ignition is turned off last time (S7). Though the mode last time was the mode for alarming because the state of the ignition last time is OFF (Yes in S7), the alarming part 5 of the ECU 2 does not perform the alarming (S8).

According to the vehicle control apparatus 1 as described above, the case where the jump start is performed in which the engine is started using power supplied from an outside the vehicle can be detected, and the driver alarmed to manually operate the stopping state maintaining mechanism 13 for maintaining the vehicle in the stop state (unmoving). Accordingly, this process can avoid the state in which the vehicle cannot be stopped due to deterioration of the battery 14 etc.

Further, when the start of the engine is performed not by the jump start in the case, and the mode last time was the mode for alarming because the state of the ignition just last time is OFF, the operation can be made as follows:

In this case, it is possible to make no alarming (S8).

Further, when the start of the engine of the vehicle has been completed, the ECU 2 determines that the start of the engine 15 last time failed (Yes in S6), the operation can be made as follows: It is possible to prompt the driver with alarming to manually operate the stopping state maintaining mechanism 13 for maintaining the stop of the vehicle.

Accordingly, this operation can avoid a state in which the vehicle cannot be stopped due to the deterioration of the battery 14, etc.

Figure 3:
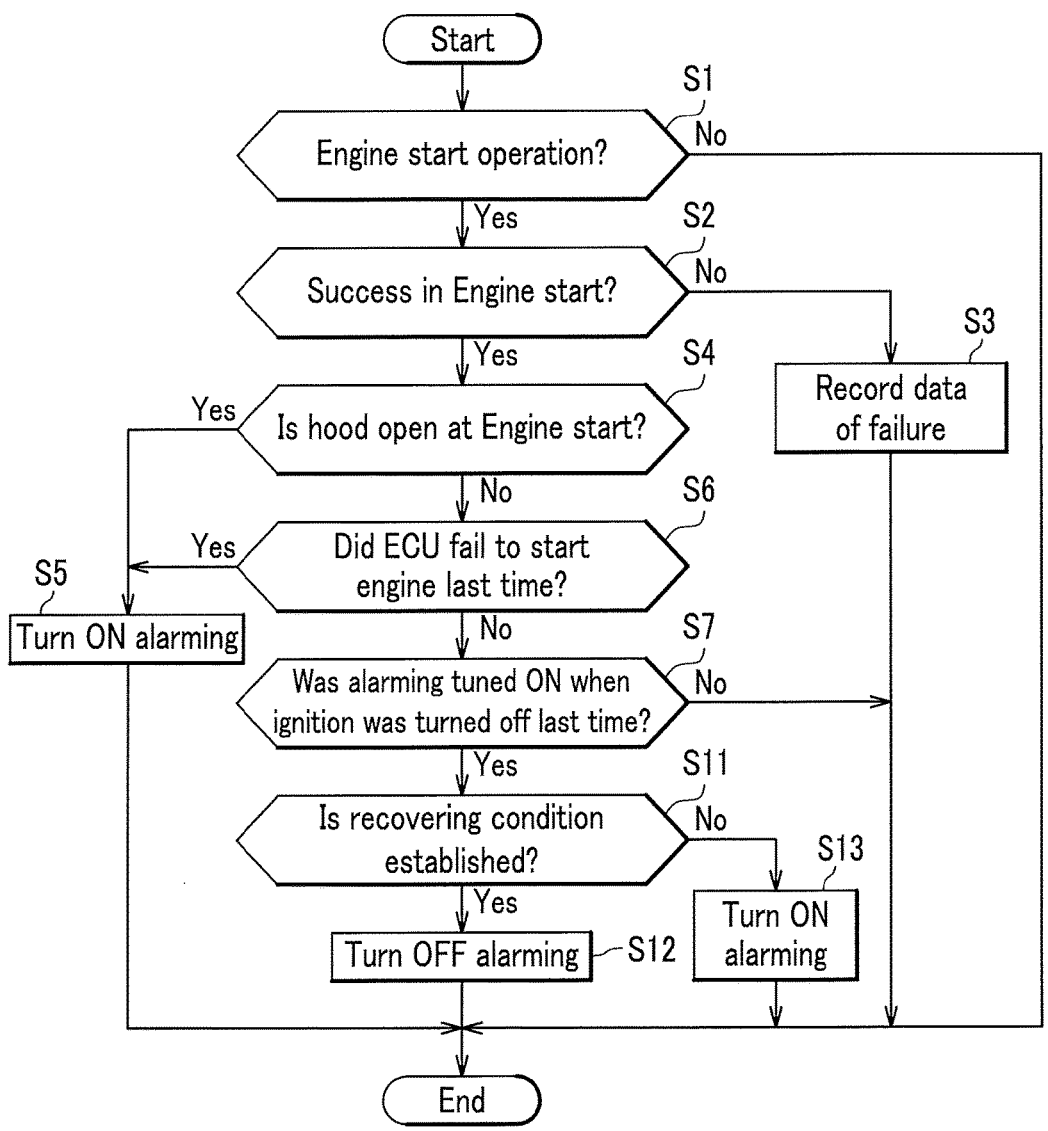
FIG. 3 is a flow chart illustrating operation of the vehicle control apparatus according to another embodiment of the present invention.

FIG. 3 is a flow chart of modification of the above-described embodiment described, referring to FIG. 2. FIG. 3 is different from FIG. 2 in that the process in the step S8 is replaced with a process defined by steps S11 to S13. More specifically, when the state is in the mode for alarming when the ignition is OFF last time (Yes in S7), the ECU 2 determines whether or not a predetermined recovering condition is satisfied (S11). When the ECU 2 can confirm that the recovering condition is established (Yes in S11), the ECU 2 does not perform the above-described alarming (S12). When the predetermined recovering condition has not been established (No in S11), the ECU 2 alarms the driver.

Accordingly, though it cannot be detected that the start of the engine 15 last time failed or that the hood is open, it can be continued to alarm (alarming ON) in the case where it can be determined that decrease in performance of the battery 14 detected last time has not been recovered.

Further, as the recovering condition, a fact that the lowest voltage out of voltages of the battery 14 which have been acquired until completion of the start of the start-up operation of the engine 15 from the start of the start-up operation of the engine 15 is larger than a predetermined value, or the fact that the engine can be successfully started without reset in an ECU having a reset voltage higher than that of the ECU 2.

The invention claimed is:

1. A vehicle control apparatus comprising:
a power supply device provided within a vehicle and adapted to supply power to the vehicle and receive power externally supplied from outside the vehicle;
a hood shutting sensor that detects whether a hood of the vehicle is open or shut; and
an electronic control unit including at least one processor, the electronic control unit programmed to:
operate a stop state maintaining mechanism of the vehicle which maintains a stop state of the vehicle;
detect a starting and stopping of an engine of the vehicle to shift the vehicle between an OFF state and an ON state;
determine that power is externally supplied from outside the vehicle to the power supply device of the vehicle when the hood of the vehicle is detected to be open by the hood shutting sensor during the starting of the engine of the vehicle detected by the electronic control unit; and
perform an alarm to prompt a vehicle user to manually operate the stop state maintaining mechanism when it is determined that the power is externally supplied from outside the vehicle, the alarm performed via at least one of a vehicle display and a vehicle speaker controlled by the electronic control unit,
wherein the electronic control unit does not perform the alarm when: the electronic control unit performed the alarm during a most recent ON state of the vehicle when the most recent ON state of the vehicle shifted to the OFF state; and the electronic control unit does not determine that the power is externally supplied from outside the vehicle during the starting of the engine of the vehicle following the shift to the OFF state from the most recent ON state of the vehicle.

2. The vehicle control apparatus as claimed in claim 1, wherein the electronic control unit is further programmed to determine
a state of the power supply device, and perform
the alarm when it is determined that the state of the power supply device is abnormal.

3. A vehicle control apparatus comprising:
a power supply device provided within a vehicle and adapted to supply power to the vehicle and receive power externally supplied from outside the vehicle;
a hood shutting sensor that detects whether a hood of the vehicle is open or shut; and an electronic control unit including at least one processor, the electronic control unit programmed to:

operate a stop state maintaining mechanism of the vehicle which maintains a stop state of the vehicle;

detect a starting and stopping of an engine of the vehicle to shift the vehicle between an OFF state and an ON state;

determine that power is externally supplied from outside the vehicle to the power supply device of the vehicle when the hood of the vehicle is detected to be open by the hood shutting sensor during the starting of the engine of the vehicle detected by the electronic control unit;

perform an alarm to prompt a vehicle user to manually operate the stop state maintaining mechanism when it is determined that power is externally supplied from outside the vehicle, the alarm performed via at least one of a vehicle display and a vehicle speaker controlled by the electronic control unit;

determine a state of the power supply device, and perform the alarm when it is determined that the state of the power supply device is abnormal; and determine whether or not the starting of the engine of the vehicle failed to shift the vehicle to the ON state during a most recent previous starting attempt, and determine that the power supply device is abnormal when it is determined that the most recent previous starting attempt failed to shift the vehicle to the ON state.

4. A vehicle control apparatus comprising:

a power supply device provided within a vehicle and adapted to supply power to the vehicle and receive power externally supplied from outside the vehicle;

a hood shutting sensor that detects whether a hood of the vehicle is open or shut; and an electronic control unit including at least one processor, the electronic control unit programmed to:

operate a stop state maintaining mechanism of the vehicle which maintains a stop state of the vehicle;

detect whether or not an engine of the vehicle is successfully started;

determine that power is externally supplied from outside the vehicle to the power supply device of the vehicle when the hood of the vehicle is detected to be open by the hood shutting sensor when the engine of the vehicle is started; and perform an alarm to prompt a vehicle user to manually operate the stop state maintaining mechanism when it is determined that the power is externally supplied from outside the vehicle and the engine of the vehicle is successfully started, the alarm performed via at least one of a vehicle display and a vehicle speaker controlled by the electronic control unit, wherein the electronic control unit is further programmed to not perform the alarm when: the electronic control unit performed the alarm during a most recent ON state of the vehicle when the most recent ON state of the vehicle shifted to an OFF state; and the electronic control unit does not determine that the power is externally supplied from outside the vehicle during starting of the engine of the vehicle following the shift to the OFF state from the most recent ON state of the vehicle.

5. The vehicle control apparatus as claimed in claim 4, wherein the electronic control unit is further programmed to determine a state of the power supply device, and perform the alarm when it is determined that the state of the power supply device is abnormal.

6. The vehicle control apparatus as claimed in claim 5, wherein the electronic control unit is further programmed to determine that the power supply device is abnormal when it is determined that the engine of the vehicle is not successfully started during a most recent starting attempt.

* * * * *